United States Patent
Chen et al.

(10) Patent No.: US 6,798,704 B2
(45) Date of Patent: Sep. 28, 2004

(54) HIGH SPEED SENSE AMPLIFIER DATA-HOLD CIRCUIT FOR SINGLE-ENDED SRAM

(75) Inventors: Hsing-Yi Chen, Hsinchu Hsien (TW); Ming Chi Lin, Taipei Hsien (TW)

(73) Assignee: Silicon Integrated Systems Corp., Hsin Chu (TW)

( * ) Notice: Subject to any disclaimer, the term of this patent is extended or adjusted under 35 U.S.C. 154(b) by 60 days.

(21) Appl. No.: 10/286,857

(22) Filed: Nov. 4, 2002

(65) Prior Publication Data

US 2004/0085842 A1 May 6, 2004

(51) Int. Cl.[7] .................................................. G11C 7/00
(52) U.S. Cl. ........................ 365/205; 365/154; 365/203
(58) Field of Search ................................ 365/205, 207, 365/203, 154

(56) References Cited

U.S. PATENT DOCUMENTS 6,154,403 A * 11/2000 Tanzawa et al. ............ 365/203
6,249,479 B1 * 6/2001 Tanzawa et al. ....... 365/230.06

FOREIGN PATENT DOCUMENTS

TW          489315         6/2002

* cited by examiner

Primary Examiner—Tan T. Nguyen
(74) Attorney, Agent, or Firm—Birch, Stewart, Kolasch & Birch, LLP

(57) ABSTRACT

A semiconductor memory with a sense amplifier for high-speed sensing of the signal from a memory cell. The semiconductor memory includes plural memory arrays having plural memory cells, a sense amplifier, and a latch circuit. The memory cells are precharged when a precharge signal is enabled. The sense amplifier has an additional discharge path enabled by the disabled precharge signal to speed up reading data. The latch circuit is turn off by the enabled precharged signal to hold the data.

6 Claims, 6 Drawing Sheets

HIGH SPEED SENSE AMPLIFIER DATA-HOLD CIRCUIT FOR SINGLE-ENDED SRAM

BACKGROUND OF THE INVENTION

1. Field of the Invention

The present invention relates to a high speed SRAM, and particularly to a single ended SRAM with a high-speed sense amplifier and a data-hold circuit.

2. Description of the Related Art

Owing to the emergency of various video devices emerging, embedded SRAM has become indispensable portion. In order to make embedded SRAM read at high speed without affecting its internal data, a high speed sense amplifier with a data-hold circuit is necessary.

Most SRAM are implemented with differential sense amplifier, which has good common-mode-rejection-ratio. But, in a multiple process architecture, it is necessary to utilize multi-port memories. For the sake of saving chip space, single ended sense amplifiers are utilized in SRAM more frequently.

FIG. 1 shows a schematic diagram of a conventional single ended sense amplifier. When an input signal Vin is at low voltage level, a NMOS transistor N10 is turned off. The NMOS transistor N12 pulls up the voltage of a node A to some level at which a PMOS transistor P16 and a NMOS transistor N16 are both turned on such that the voltage of the node B is located between Vdd and Vss. Because the NMOS transistor N12 forms a negative feedback, the voltage of the node A cannot be pulled up to Vdd. When the input signal Vin is at high voltage level, the NMOS transistor N10 is turned on, discharging the node A such that the voltage of the node A decreases to a voltage level lower than the threshold voltage of the inverter 16. Meanwhile, the NMOS transistor N12 is turned on and the voltage of the node A is limited between the threshold voltage of the inverter 16 and Vss. When the input signal is at a high voltage level, the NMOS transistor N12 and N10 are both turned on, forming a DC conducting path in which the NMOS transistor N12 impedes discharging the node A, therefore requiring more time to be pulled down to a low voltage level. There is a need for a novel sense amplifier incorporated in a SRAM, speeding up reading.

SUMMARY OF THE INVENTION

It is therefore an object of the present invention to provide a semiconductor memory and sense amplifier characterized by reading data at high speed and holding data.

To achieve the above objects, the present invention provides a semiconductor memory with a sense amplifier having an additional discharge path to speed up reading data. According to the embodiment of the invention, the semiconductor memory includes plural memory arrays having plural memory cells, a sense amplifier, and a latch circuit.

When a precharge signal is enabled, the plural memory cells are precharged. When the precharge signal is disabled, the sense amplifier's additional discharge path is enabled to speed up evaluation. The enabled precharge signal turns off a switch connected between the sense amplifier and the latch circuit to keep the latch from being affected by the sense amplifier during the precharge period.

BRIEF DESCRIPTION OF THE DRAWINGS

The aforementioned objects, features and advantages of this invention will become apparent by referring to the following detailed description of the preferred embodiment with reference to the accompanying drawings, wherein.

DETAILED DESCRIPTION OF THE PREFERRED EMBODIMENT

Figure 2:
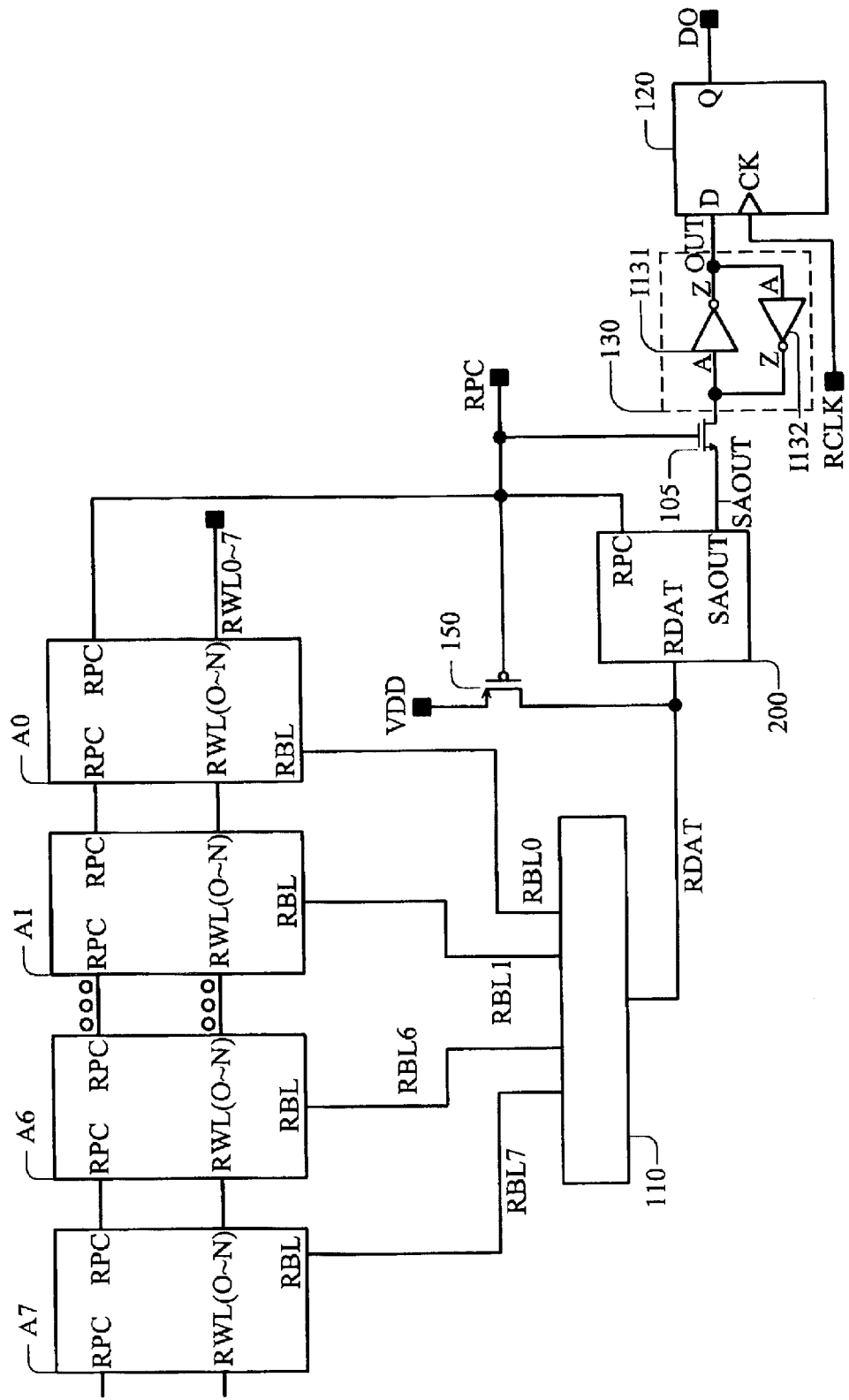
FIG. 2 is a block diagram showing the semiconductor memory according to the embodiment of the present invention.

FIG. 2 shows a block diagram of an embodiment of the present invention's static random dynamic memory (SRAM) according to the present invention. As shown in FIG. 2, the SRAM of the present invention has plural memory arrays A0~A7, which are arranged in matrix. The read-bit lines are RBL0~RBL7 respectively selected by a multiplex 110 to read data from one read-bit line of them. The output terminal of the multiplex 110 is coupled to a data line RDAT, which is coupled to a sense amplifier 200. The sense amplifier 200 is a single ended sense amplifier for speeding up reading data from memory cell.

Memory arrays A0~A7 receives a precharge signal RPC. A source of a PMOS transistor 150 is coupled to a high voltage source VDD. A drain of the PMOS transistor 150 is coupled to the data line RDAT. A gate of the PMOS transistor 150 is coupled to the precharge signal RPC.

A NMOS transistor 105 acts as a switch, wherein one end is coupled to the output terminal SAOUT of the sense amplifier 200, the other is coupled to a latch circuit 130, and the gate is coupled to the precharge signal RPC. The latch circuit 130 includes inverters I131 and I132, which are connected in a positive feedback loop for latching the data from the sense amplifier 200.

A D-type flip-flop 120, which has a data-input terminal D coupled the latch circuit 130, latches the logic data synchronously according a clock signal RCLK.

Figure 3:
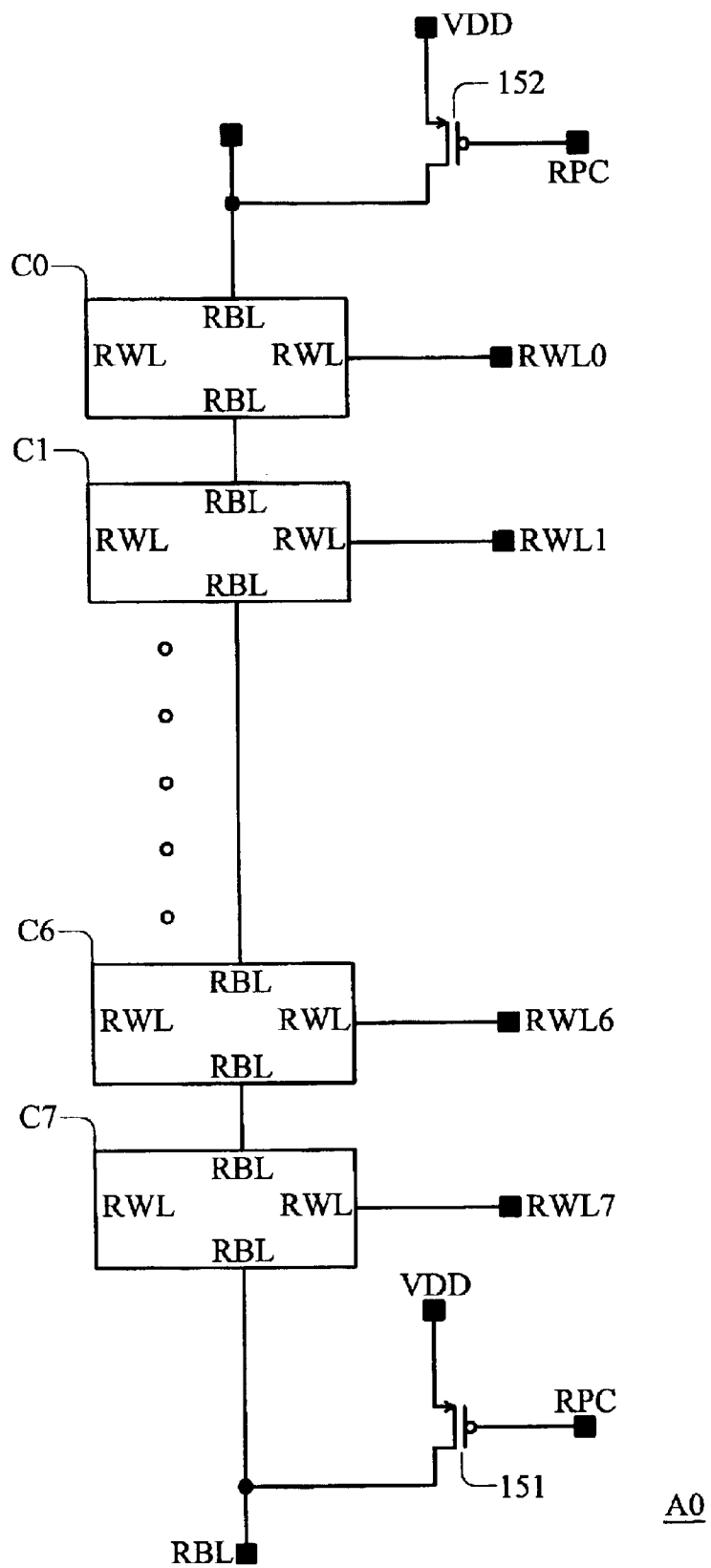
FIG. 3 is a block diagram showing the memory array according to the embodiment of the present invention.

FIG. 3 shows a block diagram of the memory array A0. The other memory array has the same block diagram. Memory array A0 includes memory cell C0~C7. The read-word signal RWL0~RWL7 are coupled to the control nodes of the memory cell C0~C7. The read terminals of the memory cell C0~C7 are all coupled to the read-bit line RBL0. The source of the PMOS transistor 151 is coupled to the high voltage source VDD, the drain is coupled to the read-bit line RBL0, and the gate is coupled to the precharge signal RPC. The PMOS transistor 152 is coupled the same way as the PMOS transistor 151, the gate of the PMOS transistor 152 is coupled to the other end of the read-bit line RBL0 for preventing the propagation delay of the read-bit line RBL0.

Figure 4:
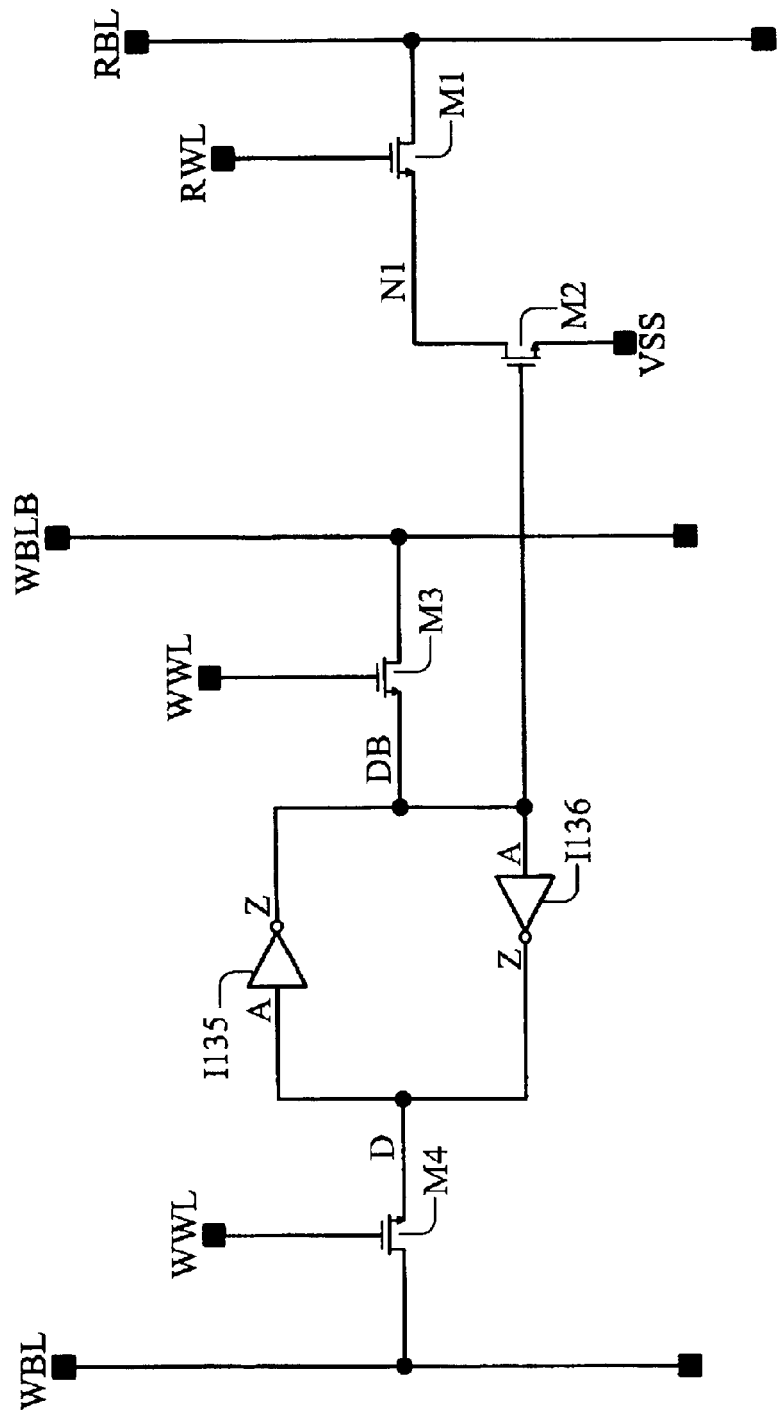
FIG. 4 is a schematic diagram showing the memory cell according to the embodiment of the present invention.

FIG. 4 shows the circuit of the memory cell C0 of the memory array A0. The other cells have the same circuit. The read terminal is coupled to the read-bit line RBL0. Transistor M1 and transistor M2 are connected in series. Transistor M1 is coupled to the read-bit line RBL0, and the transistor M2 is coupled to the low voltage source VSS. The gate of the transistor M1 is coupled to the read-word signal RWL0, and the gate of the transistor M2 is coupled to a complementary logic node DB.

An inverter I135 and an inverter I136 are connected in a positive feedback loop to form a memory cell to latch logic data. A logic data terminal D and a complementary logic data terminal DB store opposite polar logic data respectively. A logic data terminal D is coupled to the bit write terminal WBL by a write transistor M4. A complementary logic data terminal DB is coupled to the complementary bit write terminal WBLB by a write transistor M3. When write signal WWL is enabled, transistor M4 and transistor M3 are both turned on, and logic data and complementary logic data are written to the logic data terminal D and the complementary logic data terminal DB respectively by the write-bit line WBL and the complementary write-bit line WBLB.

Figure 5:
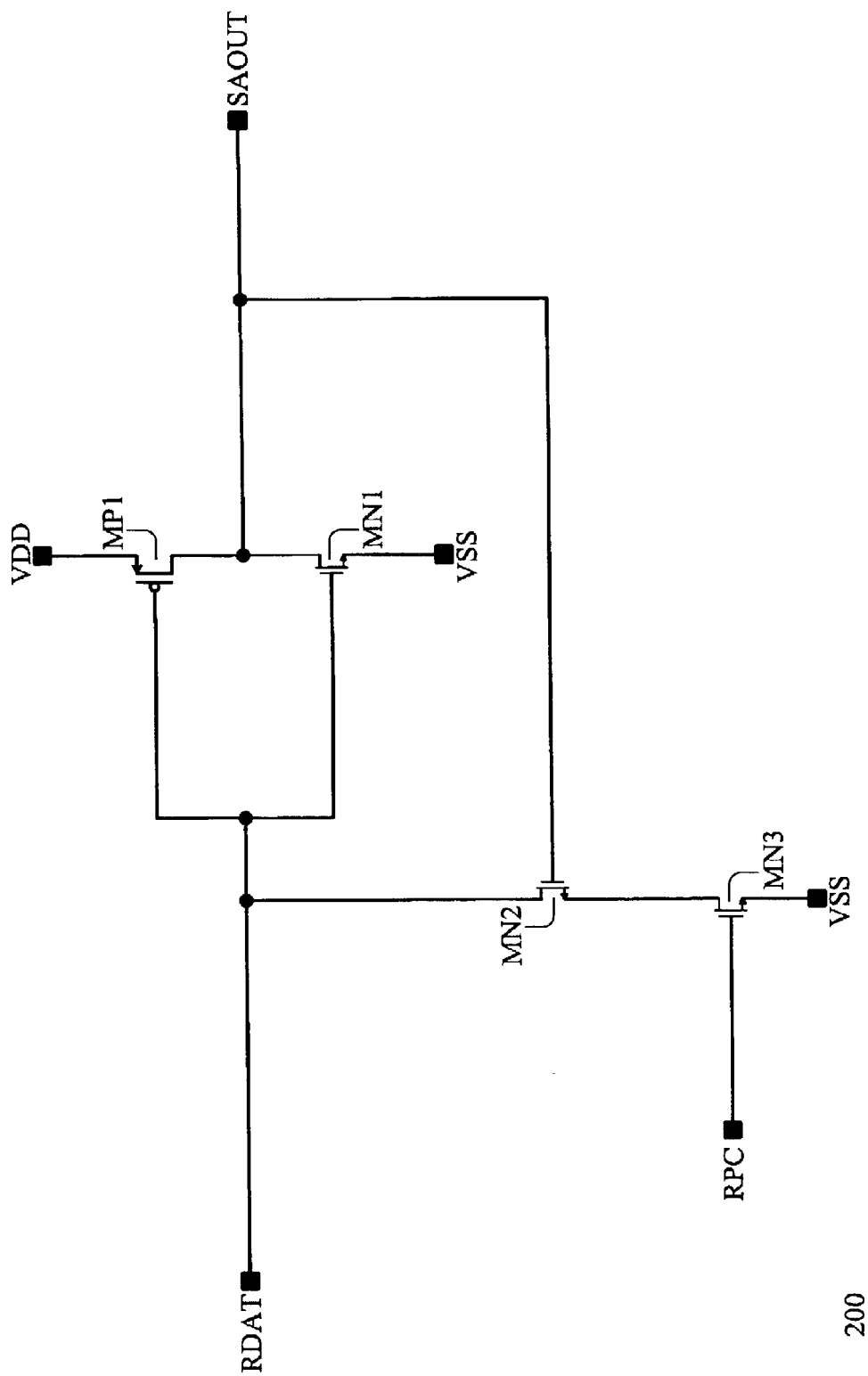
FIG. 5 is a schematic diagram showing the sense amplifier according to the embodiment of the present invention.

FIG. 5 shows the circuit of the sense amplifier 200. A PMOS transistor MP1 and a NMOS transistor MN1 are both connected in series. The source of the PMOS transistor MP1 is coupled to the high voltage source VDD. The source of the NMOS transistor MN1 is coupled to the low voltage source VSS. The gates of the PMOS transistor MP1 and the NMOS transistor are both coupled to the input terminal RDAT of the sense amplifier 200. The drain of NMOS transistor MN2 is coupled to the input terminal RDAT of the sense amplifier 200, the gate is coupled to the output terminal SAOUT of the sense amplifier 200, and the source is coupled to the drain of the NMOS transistor MN3. The source of the NMOS transistor MN3 is coupled to the low voltage source VSS, and the gate is coupled to precharge signal RPC.

Figure 1:
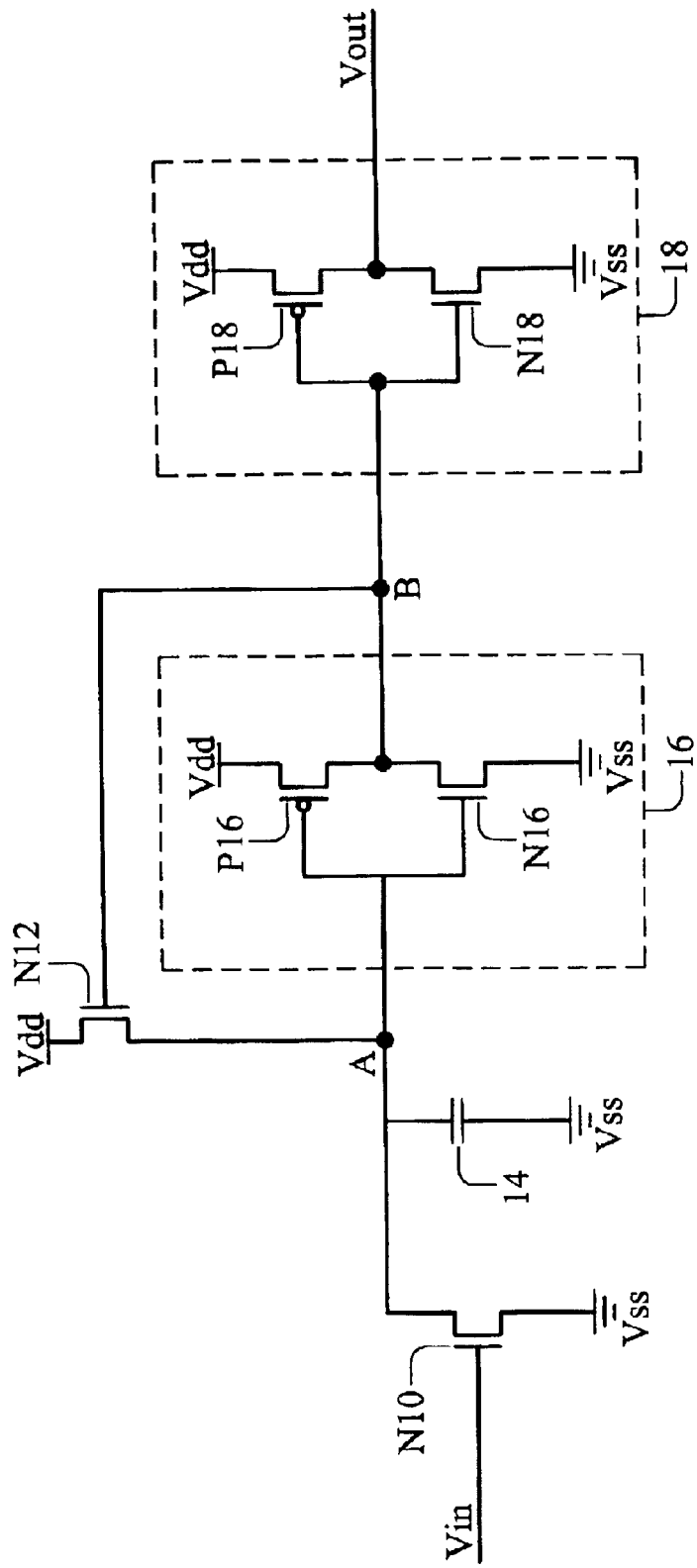
FIG. 1 is a schematic diagram showing the conventional sense amplifier.
Figure 6:
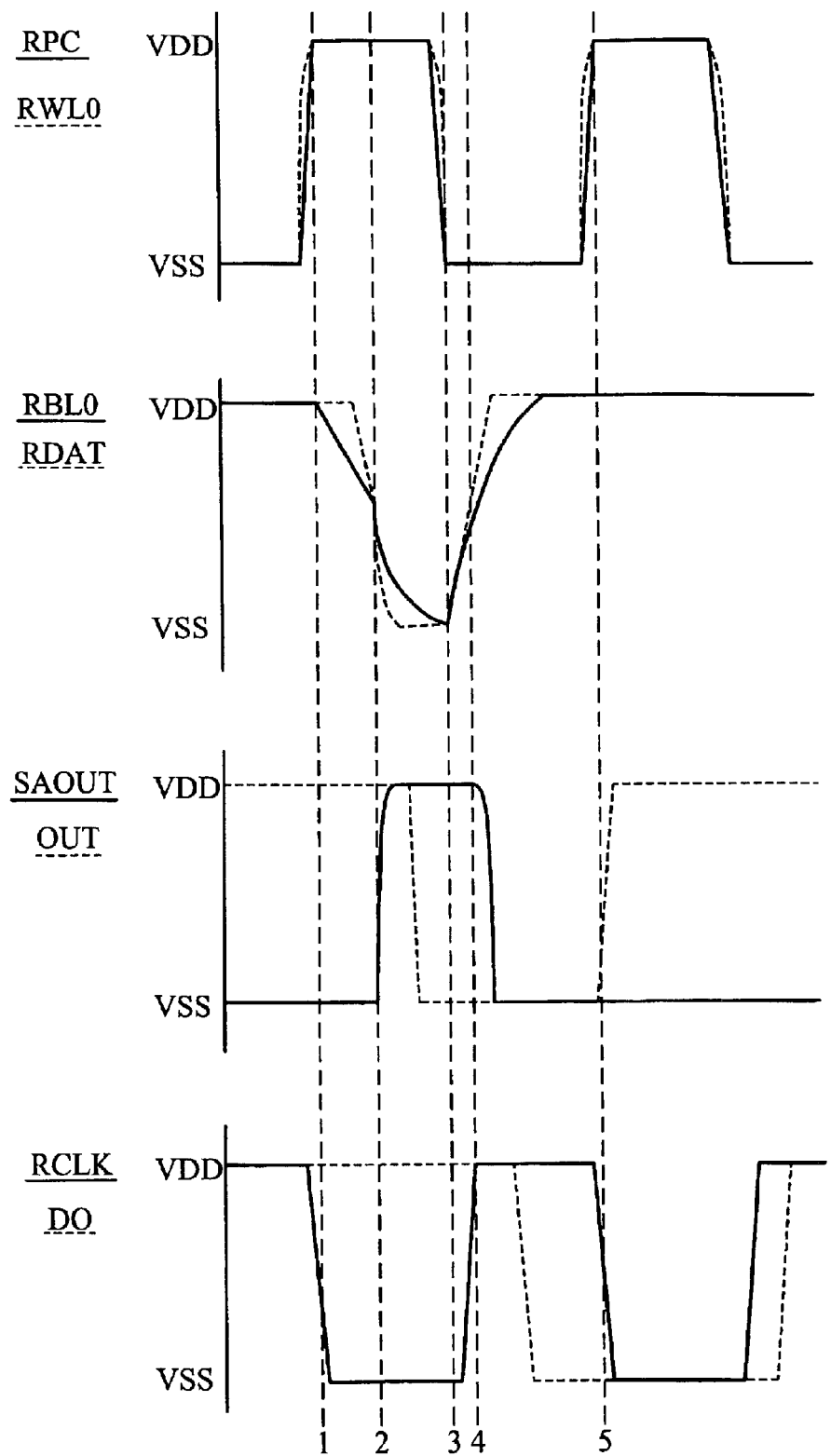
FIG. 6 is a waveform diagram showing the signal according to the semiconductor memory of the present invention.

FIG. 6 shows the waveforms of the signals in FIG. 1. The following illustrates the operation of the signals.

Before t=1:

The precharge signal RPC is at a low level such that the PMOS transistor 151 and PMOS transistor 152 in A0~A7 are both turned on, charging all the read-bit lines RBL0~RBL7 to high level.

Meanwhile, the PMOS transistor 150 is also turned on, charging the data line RDAT to high level. The MOS transistor is turned off. The NMOS transistor MN2 and MN3 in the sense amplifier 200 are turned off, too.

The multiplex 110 selects the memory array A0 before the read-word lines RWL0~RWL7 are turned on, i.e. before t1, read-bit line RBL0 is selected coupled to the data line RDAT.

At t=1:

The voltage of the read-word line RWL0 rises to high level, selecting the memory cell C0. Assume that the data stored in memory cell C0 is 0. The precharge signal RPC rises to a high level such that the PMOS transistor 150 is turned off and stops charging the data line RDAT, and PMOS transistor 151, 152 are turned off and stop charging read-bit line RBL0.

Because the precharge signal RPC is at high level, the NMOS transistor 105 is turned on, and the NMOS transistor MN3 of the sense amplifier is turned on, too.

The data stored in memory cell C0 is 0 such that the logic level of the node D is 0 and the logic level of the node DB is 1. Therefore, the NMOS transistor M2 is turned on. The read-bit line RBL0 is at a high level. The NMOS transistor M1 is turned on by the read-word line RWL0. The NMOS transistor M1, M2 form a discharge path to discharge read-bit line RBL0 and the data line RDAT.

At t=2:

When the voltage level of the data line RDAT decreases to the threshold voltage of the sense amplifier 200, the PMOS transistor MP1 starts to turn on, charging the output terminal SAOUT of the sense amplifier 200, and the NMOS transistor MN1 is turned off gradually.

When the voltage of the output terminal SAOUT of the sense amplifier 200 rises to the threshold voltage of the NMOS transistor MN2, the NMOS transistor MN2 is turned on, and forms a second discharge path with the NMOS transistor MN3 to speed up discharging the data line RDAT. As shown in FIG. 6, after t=2, the discharging speed of the read-bit line RBL0 and the data line RDAT is improved.

With the data line RDAT discharging, the node SAOUT rises up to a high level gradually. The latch circuit 130 latches the node OUT to logic level 0 through the NMOS transistor 105.

At t=3:

The voltage of the read-word line RWL0 decreases to a low level. The precharge signal RPC falls to a low level.

The PMOS transistor 151 and 152 starts to turn on, charging the read-bit line RBL0~RBL7. The PMOS transistor 150 is turned on, charging the data line RDAT.

Because the precharge signal RPC is at a low level, the NMOS transistor 105 is turned off, and the NMOS transistor MN3 in sense amplifier 200 is turned off. At the initial period of the precharging, before the node SAOUT is pulled down to a low level, the discharging path of the read data line RDAT is disabled to improve charging efficiency.

At t=4:

The voltage of the read-data line RDAT is charged up to the threshold voltage, and voltage of the node SAOUT falls to logic level 0.

Because the NMOS transistor 105 is turned off, the node SAOUT does not affected the data of the latch circuit 130.

At t=5:

Another read operation starts and the precharge signal RPC rises up to high level. The memory cell C1 is selected. If the data stored in the memory cell C1 is 0, then the previous read steps are repeated. If the data stored in the memory cell C1 is 1, the NMOS transistor M2 in C1 is turned off, the read bit line RBL0 is at logic level high, the data line RDAT maintains at high level, the node SAOUT maintains at the low level of the precharge period.

According to the above description, the SRAM of the present invention can read in high speed and hold data. The precharge signal not only reduces the read time, but also enables the sense amplifier to speed up reading low logic level and disables the latch circuit to prevent affecting the data read in the previous cycle.

Although the present invention has been described in its preferred embodiment, it is not intended to limit the invention to the precise embodiment disclosed herein. Those who are skilled in this technology can still make various alterations and modifications without departing from the scope and spirit of this invention. Therefore, the scope of the present invention shall be defined and protected by the following claims and their equivalents.

What is claimed is:

1. A semiconductor memory having plural memory cells, plural read-bit lines, a multiplex, and a read-data line, wherein the plural read-bit lines are coupled to the read-data line by the multiplex, each memory cell has a first terminal and a second terminal, comprising:

plural read-word circuits, wherein each read-word circuit is coupled between a read-bit line and a low voltage source and has a node coupled to the second terminal of the memory cell, and wherein, when a read-word signal selects a read-word circuit coupled to a memory cell storing a high logic at the second terminal such that the read-word circuit is turned on and discharges the read-bit line coupled to a low voltage;

plural first precharge circuits, coupled between a high voltage source and the plural read-bit lines, wherein, when a precharge signal is enabled, the plural first precharge circuits charge the read-bit line to a high voltage;

plural second precharge circuits, coupled between the high voltage source and the read-data lines, wherein, when the precharge signal is enabled, the plural second precharge circuits charge the read-data line to the high voltage;

a single ended sense amplifier, wherein an input terminal is coupled to the read-data line, and wherein, when a voltage of the input terminal is below a threshold voltage and the precharge signal is disabled, the single ended sense amplifier is turned on, speeding up discharging the input terminal;

a switch having a first end and a second end, the first end coupled to an output of the single end sense amplifier; and wherein one end coupled to the single ended sense amplifier; and a latch circuit, which is coupled to the second end of the switch, wherein, when the precharge signal is enabled, the switch is turned off such that the latch circuit holds a data, and when the precharge signal is disabled, the switch is turned on such that the latch circuit latches an output data of the single ended sense amplifier.

2. A semiconductor memory as claimed in claim 1, wherein the single ended sense amplifier comprising:

a first PMOS transistor, wherein a drain is coupled to the output terminal of the single ended sense amplifier, a source is coupled to the high voltage source, a gate is coupled to the input terminal of the single ended sense amplifier;

a first NMOS transistor, wherein a drain is coupled to the output terminal of the single ended sense amplifier, a source is coupled to the low voltage source, a gate is coupled to the input terminal of the single ended sense amplifier;

a second NMOS transistor, wherein a drain is coupled to the input terminal of the single ended sense amplifier, a gate is coupled to the output terminal of the single ended sense amplifier; and a third NMOS transistor, wherein a drain is coupled to a source of the second NMOS transistor, a source is coupled to the low voltage source, and a gate is coupled to the precharge signal.

3. A semiconductor memory as claimed in claim 1, wherein the plural first precharge circuits comprises:

plural PMOS transistors, wherein drains are coupled to the read-bit line, sources are coupled to the high voltage source, and gates receive the precharge signal.

4. A semiconductor memory as claimed in claim 1, wherein the plural second precharge circuits comprises:

plural PMOS transistors, wherein drains are coupled to the read-data line, sources are coupled to the high voltage source, and gates receive the precharge signal.

5. A semiconductor memory as claimed in claim 1, wherein the read-word circuit comprises:

a fourth NMOS transistor, wherein a drain is coupled to the read-bit line, a gate receives the read-word signal; and a fifth NMOS transistor, wherein a drain is coupled to a source of the fourth NMOS transistor, a gate is coupled to a complementary logic node of the memory cell, a source is coupled to the low voltage source.

6. A semiconductor memory as claimed in claim 1, wherein the memory cell comprises:

a first write transistor, a NMOS transistor, wherein a drain is couple to a first bit line, a gate is coupled to a write signal;

a first inverter, wherein an input terminal is coupled to a source of the first write transistor;

a second write transistor, a NMOS transistor, wherein a drain is coupled to a second bit line, a gate receives the write signal, a source is coupled to a output terminal of the first inverter; and a second inverter, wherein an input terminal is coupled to the output terminal of the first inverter, and an output terminal, the second terminal, is coupled to the input terminal of the first inverter.

* * * * *